(12) United States Patent
Han et al.

(10) Patent No.: US 9,627,205 B2
(45) Date of Patent: Apr. 18, 2017

(54) METHOD OF MANUFACTURING A SEMICONDUCTOR DEVICE USING PURIFIED BLOCK COPOLYMERS AND SEMICONDUCTOR DEVICES

(71) Applicant: Samsung Electronics Co., Ltd., Suwon-si (KR)

(72) Inventors: Jun Won Han, Seoul (KR); Su-Jin Kwon, Hwaseong-si (KR); Hye-Ryun Kim, Yongin-si (KR); Jae-Hyun Kim, Yongin-si (KR); Jung-Sik Choi, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 260 days.

(21) Appl. No.: 14/511,191

(22) Filed: Oct. 10, 2014

(65) Prior Publication Data

US 2015/0162195 A1 Jun. 11, 2015

(30) Foreign Application Priority Data

Dec. 6, 2013 (KR) ........................ 10-2013-0151342

(51) Int. Cl.
| | | |
|---|---|---|
| H01L 21/4763 | (2006.01) | |
| H01L 21/033 | (2006.01) | |
| C08L 53/00 | (2006.01) | |
| H01L 21/311 | (2006.01) | |
| C08F 297/02 | (2006.01) | |
| H01L 21/768 | (2006.01) | |
| G03F 7/00 | (2006.01) | |

(52) U.S. Cl.
CPC ...... *H01L 21/0337* (2013.01); *C08F 297/026* (2013.01); *C08L 53/00* (2013.01); *G03F 7/0002* (2013.01); *H01L 21/0332* (2013.01); *H01L 21/31144* (2013.01); *H01L 21/76816* (2013.01)

(58) Field of Classification Search
None
See application file for complete search history.

(56) References Cited

U.S. PATENT DOCUMENTS

| | | | |
|---|---|---|---|
| 6,565,763 B1 * | 5/2003 | Asakawa | B82Y 10/00 216/22 |
| 7,138,490 B2 | 11/2006 | Nakanishi et al. | |
| 7,521,090 B1 | 4/2009 | Cheng et al. | |
| 7,838,600 B2 | 11/2010 | Luo et al. | |

(Continued)

FOREIGN PATENT DOCUMENTS

| | | |
|---|---|---|
| KR | 10-2004-0035206 A | 4/2004 |
| KR | 10-2012-0125897 A | 11/2012 |
| KR | 10-2013-0003676 A | 1/2013 |

*Primary Examiner* — Angel Roman
(74) *Attorney, Agent, or Firm* — Muir Patent Law, PLLC

(57) ABSTRACT

In a method of manufacturing a semiconductor device, a blend solution that includes a block copolymer and an adsorbent is prepared. The block copolymer is synthesized by a copolymerization between a first polymer unit and a second polymer unit having a hydrophilicity greater than that of the first polymer unit. The adsorbent on which the block copolymer is adsorbed is extracted. The block copolymer is separated from the adsorbent. The block copolymer is collected. The block copolymer may be used to form a mask on an object layer on a substrate and the mask used to etch the object layer.

20 Claims, 14 Drawing Sheets

(56) References Cited

U.S. PATENT DOCUMENTS

| | | |
|---|---|---|
| 8,314,206 B2 | 11/2012 | Millward et al. |
| 2009/0227703 A1 | 9/2009 | Puskas |
| 2012/0088192 A1 | 4/2012 | Trefonas et al. |
| 2013/0012661 A1 | 1/2013 | Puskas |
| 2013/0081683 A1* | 4/2013 | Masunaga ............... H01L 31/06 136/255 |
| 2014/0094034 A1* | 4/2014 | Oyama ............... H01L 21/3086 438/694 |
| 2014/0346142 A1* | 11/2014 | Chapuis ............... G03F 7/0002 216/51 |
| 2016/0215085 A1* | 7/2016 | Han ......................... C08F 6/12 |

* cited by examiner

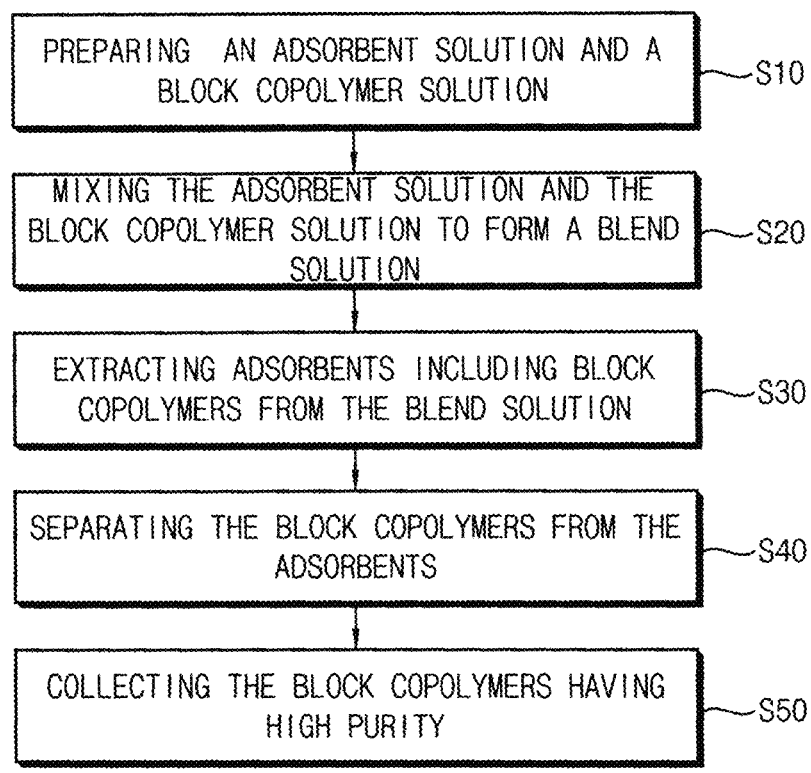
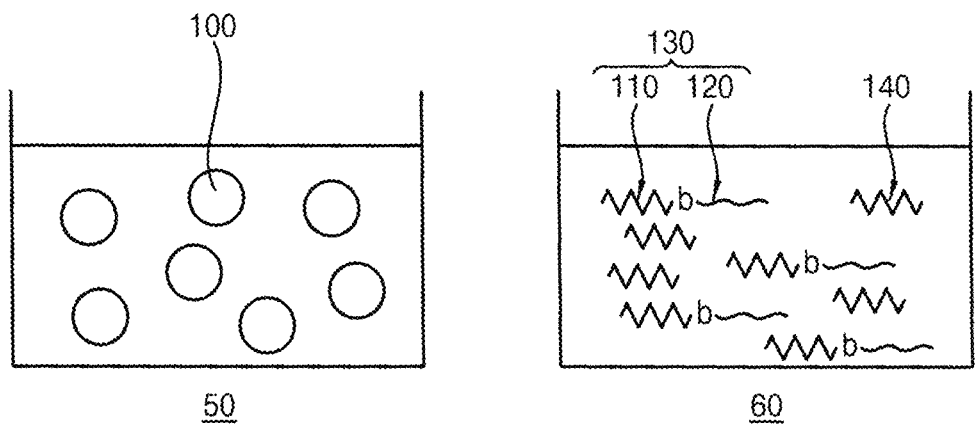

FIG. 15
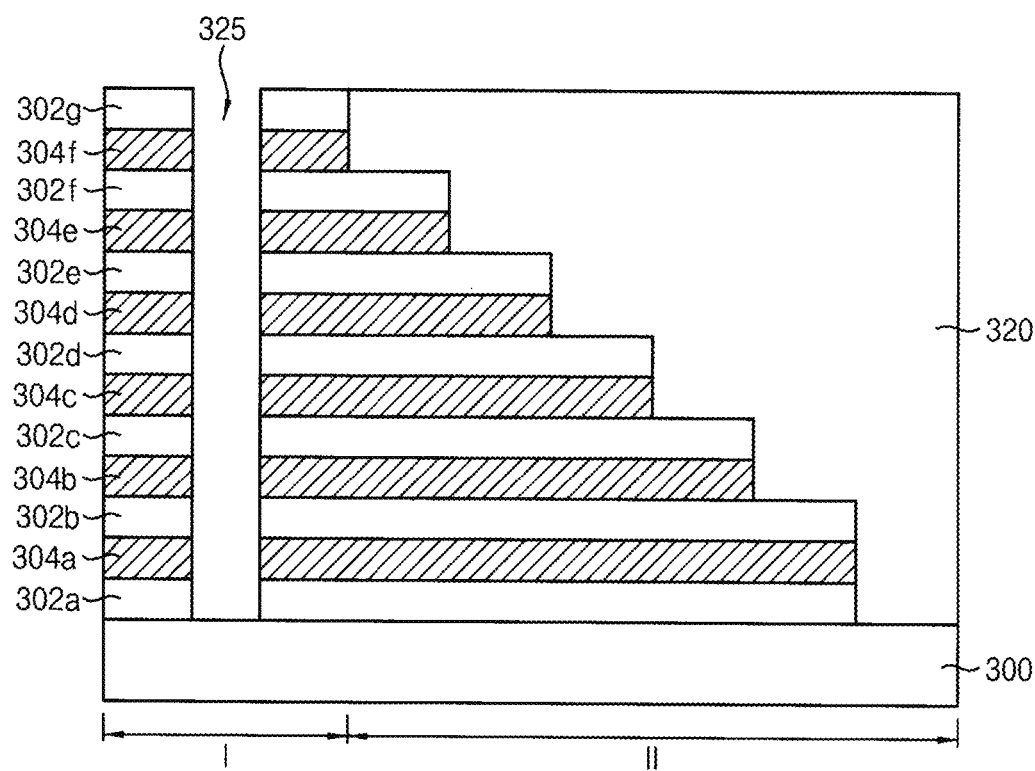
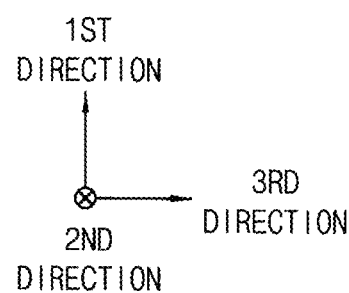

FIG. 17
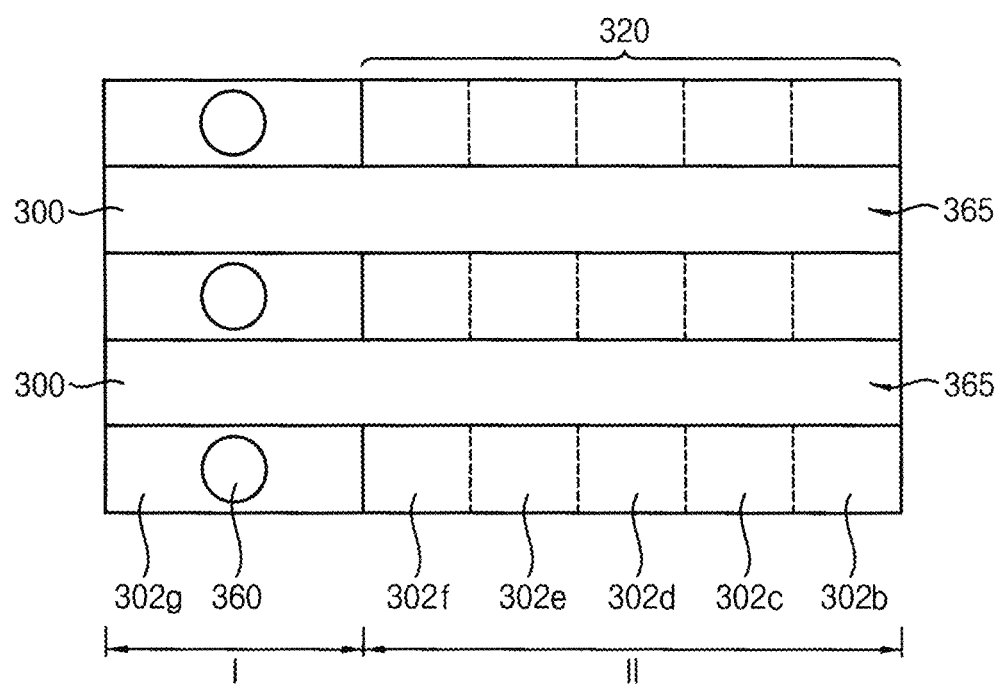
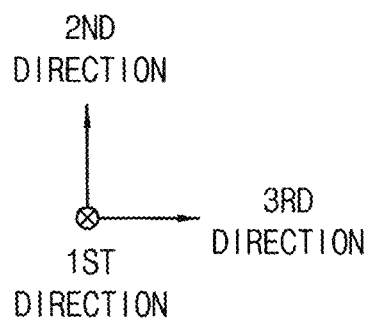

FIG. 20
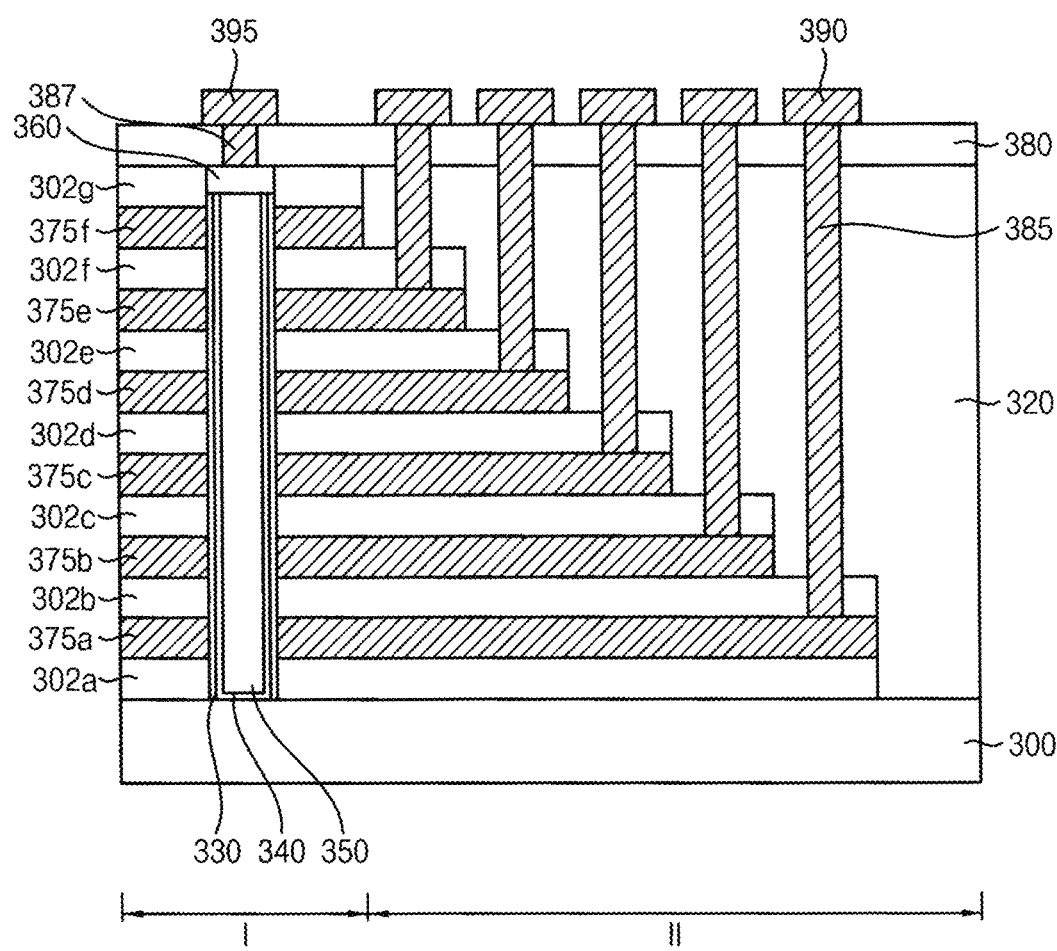
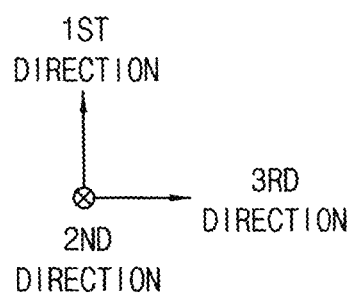

METHOD OF MANUFACTURING A SEMICONDUCTOR DEVICE USING PURIFIED BLOCK COPOLYMERS AND SEMICONDUCTOR DEVICES

CROSS-REFERENCE TO RELATED APPLICATION

This application claims priority under 35 USC §119 to Korean Patent Application No. 10-2013-0151342, filed on Dec. 6, 2013 in the Korean Intellectual Property Office (KIPO), the contents of which are incorporated by reference herein in their entirety.

BACKGROUND

1. Field

Example embodiments relate to purification methods of block copolymers and methods of forming patterns using the block copolymers.

2. Description of the Related Art

Photolithography has been widely used for forming a pattern of a semiconductor device. However, a pattern having a critical dimension below, e.g., 40 nm is difficult to obtain through the photolithography process due to a resolution limit. Thus, a double patterning method (e.g., using at least two mask types) has been researched. However, the double patterning method may require complicated steps and excessive process cost.

Accordingly, a direct self assembly (DSA) method using a block copolymer has been developed. In the DSA method, the block copolymer having a high purity may be needed.

SUMMARY

Example embodiments provide a purification method of a block copolymer for a formation of a minute pattern.

Example embodiments provide a method of forming a pattern using the block copolymer.

According to example embodiments, there is provided a purification method of a block copolymer. In the method, a blend solution including a block copolymer and an adsorbent is prepared. The block copolymer is synthesized by a copolymerization between a first polymer unit and a second polymer unit having a hydrophilicity greater than that of the first polymer unit. The adsorbent on which the block copolymer is adsorbed is extracted. The block copolymer is separated from the adsorbent. The block copolymer is collected.

In example embodiments, the adsorbent may include silica particles or zirconia particles.

In example embodiments, the second polymer unit may be adsorbed on the adsorbent.

In example embodiments, the first polymer unit may include polystyrene (PS). The second polymer unit may include polymethylmethacrylate (PMMA), polydimethylsiloxane (PDMS), polyvinylpyrrolidone (PVP) or polyethyleneoxide (PEO).

In example embodiments, in the preparing the blend solution, a first solvent and the adsorbent may be mixed to prepare an adsorbent solution. A second solvent and the block copolymer may be mixed to prepare a first block copolymer solution. The adsorbent solution and the first block copolymer solution may be mixed.

In example embodiments, the first solvent and the second solvent may include a main solvent and an assistance solvent. The assistance solvent may have a polymer solubility less than that of the main solvent.

In example embodiments, the main solvent may include tetrahydrofuran (THF), triethylamine (TEA), dimethylformamide (DMF), ethylacetate or dimethyl sulfoxide (DMSO). These may be used alone or in a combination thereof. The assistance solvent may include isooctane (IO).

In example embodiments, a portion of the first polymer unit may not participate in the copolymerization to remain in the first block copolymer solution as homopolymers.

In example embodiments, the block copolymer may be exclusively adsorbed on the adsorbent, and the homopolymers may be excluded from the adsorbent.

In example embodiments, in the extraction of the adsorbent, the blend solution may be provided on a filter to filtrate the adsorbent. In the separation of the block copolymer from the adsorbent, a desorption solvent may be provided on the filtrated adsorbent to prepare a second block copolymer solution that includes the block copolymer desorbed from the adsorbent.

In example embodiments, the desorption solvent may include THF, TEA, DMF, ethylacetate or DMSO. These may be used alone or in a combination thereof.

In example embodiments, in the collection of the block copolymer, the second block copolymer solution may be provided into a polymer precipitation solvent to precipitate the block copolymer.

In example embodiments, the first and second polymer units may form self-aligned patterns. A weight average molecular weight of the collected block copolymer may range from about 50,000 to about 70,000.

According to example embodiments, there is provided a method of forming a pattern. In the method, an object layer is formed on a substrate. A guide pattern and a neutral layer pattern are formed on the object layer. A block copolymer solution that includes a block copolymer having a self-aligned property and homopolymers is prepared. The block copolymer is selectively extracted by an adsorbent. A self-aligned layer including the extracted block copolymer is formed on the guide pattern and the neutral layer pattern, such that a first self-aligned pattern and a second self-aligned pattern aligned on the neutral layer pattern and the guide pattern, respectively, are formed. One of the first self-aligned pattern and the second self-aligned pattern is removed to form a mask pattern. The object layer is partially etched using the mask pattern to form an object layer pattern. In example embodiments, the block copolymer may include polystyrene-b-polymethylmethacrylate (PS-b-PMMA), and the homopolymers may include polystyrene that is not copolymerized.

The adsorbent may comprise inorganic oxide particles. The oxide particles may have an average particle size of from 1 to 100 microns.

The adsorbent may comprise a porous inorganic oxide filter.

The collected block copolymer may comprise less than 1 wt %, less than 0.2 wt % or less than 0.05 wt % of unreacted first or second polymer. The block copolymer may have a weight average molecular weight of 50,000 g/mol or more. The block copolymer may have a poly dispersity index of less than 1.40.

According to example embodiments of the present invention, block copolymers may be selectively adsorbed on an adsorbent, e.g., silica particles by a hydrophilic unit included in the block copolymer. The adsorbent including the block copolymer may be filtrated, and then the block copolymer may be separated from the adsorbent. Thus, the block copolymer having a high purity may be obtained. Further, a minute pattern having an improved uniformity may be formed using the block copolymer.

BRIEF DESCRIPTION OF THE DRAWINGS

Example embodiments will be more clearly understood from the following detailed description taken in conjunction with the accompanying drawings. FIGS. 1 to 22 represent non-limiting, example embodiments as described herein.

FIG. 1 is a flow chart illustrating a purification method of a block copolymer in accordance with example embodiments;

FIGS. 2 to 5 are schematic views illustrating a purification method of a block copolymer in accordance with example embodiments;

FIGS. 6 to 12 are cross-sectional views illustrating a method of forming a pattern in accordance with example embodiments;

FIG. 13 to FIG. 20 are cross-sectional views and a top plan view illustrating a method of manufacturing a semiconductor device in accordance with example embodiments; and FIGS. 21 and 22 are atomic force microscope (AFM) images showing PS-b-PMMA obtained from Comparative Example and Example, respectively.

DESCRIPTION OF EMBODIMENTS

Figure 3:
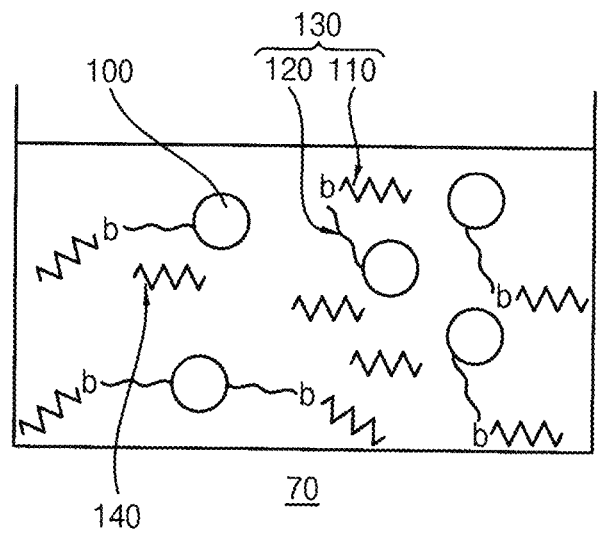

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
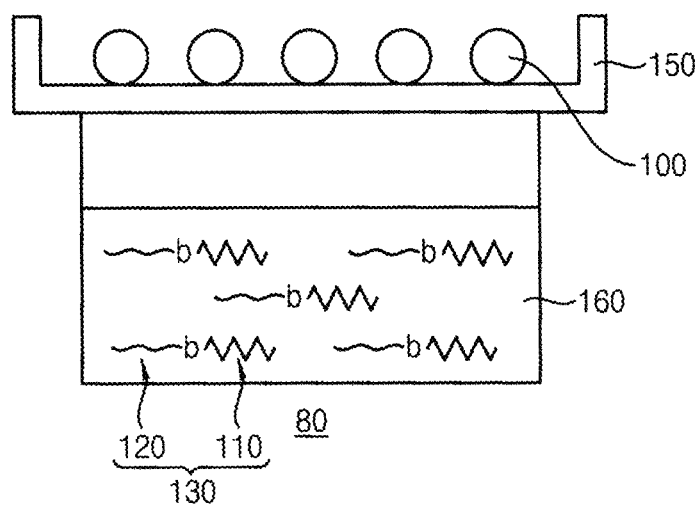

FIG. 1 is a flow chart illustrating a purification method of a block copolymer in accordance with example embodiments. FIGS. 2 and 5 are schematic views illustrating a purification method of a block copolymer in accordance with example embodiments.

Referring to FIGS. 1 and 2, in step S10, an adsorbent solution 50 and a first block copolymer solution 60 may be prepared independently.

The adsorbent solution 50 may include an adsorbent 100 dispersed in a first solvent. The adsorbent 100 may include inorganic particles having a good adsorption property. Ceramic particles, such as oxide particles can be used as the adsorbent. In example embodiments, silica particles, titania particles, alumina particles, or zirconia particles may be used as the adsorbent 100. Other oxide particles, such as hafnia, magnesia, ceria, thoria, niobia, samaria or ferric oxide may also be used. Particles that are combinations of different oxides (silica and titania, silican and zirconia, or any combinations of the aforementioned oxides) are possible, as well as multilayer particles (e.g., a particle with an inner core of silica and with an outer layer of zirconia for example, or any multilayer combinations of the aforementioned oxides as desired).

The adsorbent particles can be provided in any suitable size, such as particles having an average particle size of greater than 1 micron, such as from 1 to 100 micron, or 10 microns or more. However smaller adsorbent particles can also be used, such as particles having an average particle size of less than 1 micron (e.g. from 50 to 900 nm). Also, though particles are the preferred adsorbent, other types of adsorbents for separating the copolymer can be used, such as a fixed porous filter, or other filter with increased surface area for adsorbing the copolymer.

The first solvent of the adsorbent solution 50 may include a main solvent and an assistance solvent. An organic solvent having a good solubility with respect to a polymer material may be used as the main solvent. For example, the main solvent may include tetrahydrofuran (THF), triethylamine (TEA), dimethylformamide (DMF), ethylacetate or dimethyl sulfoxide (DMSO). These may be used alone or in a combination thereof. The assistance solvent may include an organic solvent having a solubility with respect to the polymer material less than that of the main solvent. For example, isooctane (IO) may be used as the assistance solvent.

In a case that the silica particles are used as the adsorbent 100, the silica particles may not be dissolved in the first solvent so that the adsorbent solution 50 may be prepared as a dispersion having the first solvent and the adsorbent 100 dispersed therein.

The first block copolymer solution 60 may include block copolymers 130 dissolved in a second solvent. The second solvent may include a solvent substantially the same or similar to the first solvent of the adsorbent solution 50. As described above, the second solvent may include the main solvent and the assistance solvent. For example, the main solvent may include THF, TEA, DMF, ethyl acetate or DMSO which have a good solubility with respect to the polymer material. The assistance solvent may include an organic solvent having a relatively poor solubility with respect to the polymer material, such as IO.

The block copolymer 130 may include a first polymer unit 110 (indicated as a polygonal line) and a second polymer unit 120 (indicated as a wavy line). The block copolymer 130 may be formed by a copolymerization of the first and second polymer units 110 and 120.

The second polymer unit 120 may include a polymer more hydrophilic than that of the first polymer unit 110. In example embodiments, the first polymer unit 110 may include polystyrene (PS). The second polymer unit 120 may include polymethylmethacrylate (PMMA), polydimethylsiloxane (PDMS), polyvinylpyrrolidone (PVP) or polyethyleneoxide (PEO). If PS is used as the first polymer unit 110, and PMMA, PDMS, PVP and PEO are used as the second polymer unit 120, the block copolymer 130 may be represented as PS-b-PMMA, PS-b-PDMS, PS-b-PVP and PS-b-PEO, respectively. In the following description, PS-b-PMMA is described as the block copolymer 130, but it is intended that other block copolymers may be used instead or in addition, such as those previously mentioned or others.

The block copolymer 130 may be prepared by an anionic polymerization mechanism. As for PS-b-PMMA, styrene monomers may be polymerized using an initiator such as sec-butyl lithium (BuLi) to form PS. Methylmethacrylate (MMA) monomers may be introduced in a state that the synthesized PS is not terminated so that an anion may exist at one end of the synthesized PS. Accordingly, PS-b-PMMA may be synthesized by the anionic polymerization mechanism.

In a case that an excessive amount of PS is used, PS which is not reacted with MMA may remain as homopolymers 140. Thus, if the as-synthesized block copolymers 130 are dissolved in the organic solvent without an additional purification, the first block copolymer solution 60 may include the block copolymers 130 and the homopolymers 140 as impurities.

In example embodiments, the homopolymer 140 may include the first polymer unit 110 that may not participate in a copolymerization. In one example embodiment, the homopolymer 140 may include PS.

Referring to FIGS. 1 and 3, in step of S20, the adsorbent solution 50 and the first block copolymer solution 60 may be mixed to form a blend solution 70.

In example embodiments, the first block copolymer solution 60 may be poured into the adsorbent solution 50 to be stirred for a sufficient time. Accordingly, the second polymer unit 120 of the block copolymer 130 having a relatively strong hydrophilicity may be adsorbed on the adsorbent 100. In the case that the silica particles are used as the adsorbent 100, the silica particle may be interacted with the hydrophilic second polymer unit 120, e.g., PMMA. Thus, the second polymer unit 120 may be adsorbed on the silica particle by an attractive force therebetween. FIG. 3 illustrates that the second polymer unit 120 is adsorbed on a surface of the adsorbent 100. However, the second polymer unit 120 may be captured in a pore of the adsorbent 100 when the adsorbent 100 includes porous particles.

The homopolymers 140 in the first block copolymer solution 60 may not be adsorbed on the adsorbent 100 to remain in the blend solution 70. In one example embodiment, the homopolymer 140, e.g., PS may have a strong hydrophobicity so that a repulsive force or a weak interaction may occur between the homopolymer 140 and the adsorbent 100. Thus, the homopolymers 140 may exist in the blend solution 70 as the impurities.

As described above, the blend solution 70 may also include the main solvent and the assistance solvent. The main solvent may serve as a medium of the interaction between the block copolymer 130 and the adsorbent 100. When the adsorbent 100 has an excessive absorptivity due to, e.g., a large surface area thereof, the block copolymer 130 and the homopolymer 140 may be indiscriminately adsorbed on the adsorbent 100. The assistance solvent may be provided to reduce the interaction between the polymer units and the adsorbent 100 so that the homopolymer 140 may be prevented from being adsorbed on the adsorbent 100.

Figure 4:
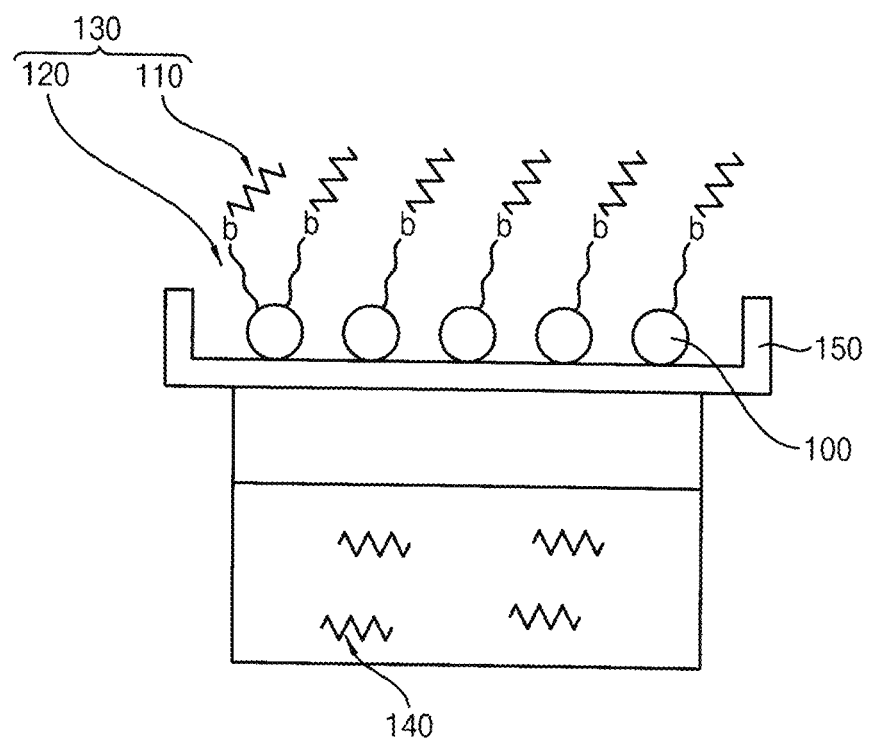

Referring to FIGS. 1 and 4, in step of S30, the adsorbent 100 including the block copolymer 130 adsorbed thereon may be selectively extracted from the blend solution 70.

In example embodiments, the adsorbent 100 may be selectively extracted by a filtration process. For example, the blend solution 70 described with reference to FIG. 3 may be introduced through a filter 150 to filtrate the adsorbent 100 including the block copolymer 130 adsorbed thereon. For example, a filter paper or a mesh structure may be used as the filter 150. The adsorbent 100 may not be dissolved in the blend solution 70 to be dispersed therein so that the adsorbent 100 may remain on the filter 150. The homopolymers 140 dissolved in the blend solution 70 may penetrate the filter 150 together with the solvent to be separated and/or removed from the adsorbent 100.

Referring to FIGS. 1 and 5, the block copolymers 130 may be separated from the filtrated adsorbent 100.

In example embodiments, a desorption solvent 160 may be provided on the adsorbent 100 to separate the block copolymers 130 from the adsorbent 100. The desorption solvent 160 may be poured on the filter 150 on which the adsorbent 100 remains to penetrate the filter 150 together with the separated or desorbed block copolymers 130.

The desorption solvent 160 may include an organic solvent having a high solubility with respect to the polymer material. For example, the desorption solvent 160 may include THF, DMSO, TEA, ethylacetate or DMF. These may be used alone or in a combination thereof. The adsorbent 100 may be washed by the desorption solvent 160 so that the block copolymers 130 may be separated from the adsorbent 100 to be dissolved in the desorption solvent 160. Accordingly, the block copolymers 130 having a high purity, from which the homopolymers 140 are removed may be contained in the desorption solvent 160. Therefore, a second block copolymer solution 80 in which the block copolymers 160 having the high purity are dissolved may be obtained.

Referring now to FIG. 1, in step of S50, the block copolymers 130 having the high purity may be collected.

In example embodiments, the second block copolymer solution 80 may be concentrated, and then the block copolymers 130 may be precipitated. For example, the concentrated second block copolymer solution 80 may be provided into a polymer precipitation solvent, so that the block copolymers 130 may be precipitated. The polymer precipitation solvent may include a solvent having a poor solubility with respect to the polymer material. For example, the polymer precipitation solvent may include an alcohol-based solvent such as methanol or ethanol.

The precipitated block copolymers 130 may be filtrated and/or dried to achieve the purified block copolymers 130. In one example embodiment, a process described with reference to FIGS. 1 to 5 may be repeated to obtain a desired amount of the block copolymers 130.

FIGS. 6 to 12 are cross-sectional views illustrating a method of forming a pattern in accordance with example embodiments. For example, FIGS. 6 to 12 illustrate a DSA method for forming a minute pattern using the block copolymers purified as illustrated with reference to FIGS. 1 to 5.

Figure 6:
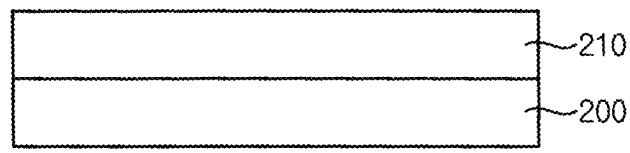

Referring to FIG. 6, an object layer 210 may be formed on a substrate 200.

The substrate 200 may include a semiconductor substrate formed of silicon or germanium, a silicon-on-insulator (SOI) substrate, a germanium-on-insulator (GOI) substrate, or an insulating substrate formed of an insulation material. A structure including, e.g., a gate structure, an impurity region, etc., may be further formed on the substrate 200.

The object layer 210 may be partially etched to be transformed into a line pattern or a contact hole. The object layer 210 may be formed using an insulation material such as silicon oxide or silicon nitride. Alternatively, the object layer 210 may be formed using a conductive material, e.g., a metal, a metal nitride, a metal silicide or doped polysilicon.

In one example embodiment, an anti-reflective layer may be further formed on the object layer 210.

Figure 7:
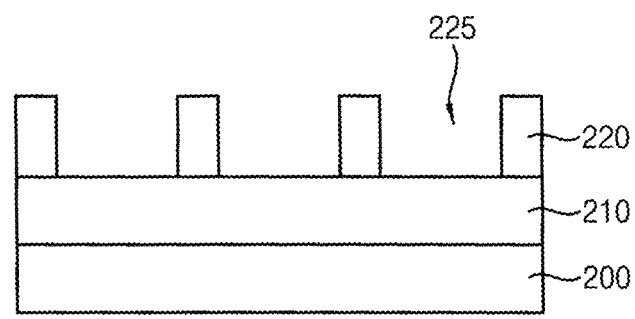

Referring to FIG. 7, a guide pattern 220 may be formed on the object layer 210.

In example embodiments, a photoresist layer may be formed on the object layer 210. The photoresist layer may be selectively exposed to light and developed to form a guide pattern 220. An opening 225 may be defined by the guide pattern 220. For example, the guide pattern 220 may include a plurality of line patterns arranged by a predetermined pitch or a predetermined line and space (LS). In this case, the opening 225 may extend linearly to have a substantial trench shape. In one example embodiment, the opening 225 may have a substantial hole shape. In example embodiments, a top surface of the object layer 210 may be exposed by the opening 225.

The photoresist layer may include a hydrophilic material. For example, a carboxylic group (—COOH) or a hydroxyl group (—OH) may be exposed from a surface of the photoresist layer so that the photoresist layer may possess a hydrophilicity.

Figure 8:
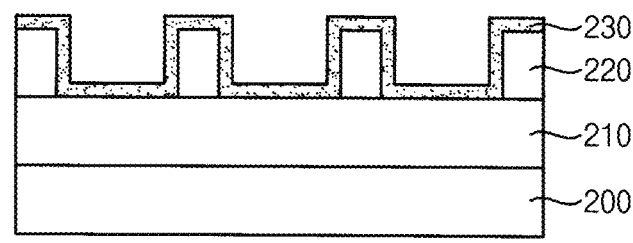

Referring to FIG. 8, a neutral layer 230 may be formed on the object layer 210 and the guide pattern 220. The neutral layer 230 may be formed conformably on surfaces of the guide pattern 220 and the object layer 210.

In example embodiments, the neutral layer 230 may be formed using a random copolymer in which a first polymer unit and a second polymer unit may be randomly arranged. Examples of the random copolymer may include PS-r-PMMA, PS-r-PDMS, PS-r-PVP or PS-r-PEO. The first and second polymer units, having a different electrical property from each other, may be randomly arranged in the random copolymer 120 so that the neutral layer 230 may be electrically neutralized.

In example embodiments, a neutral layer composition including the random copolymer and an organic solvent such as toluene may be coated by, e.g., a spin coating process and cured to obtain the neutral layer 230.

Figure 9:
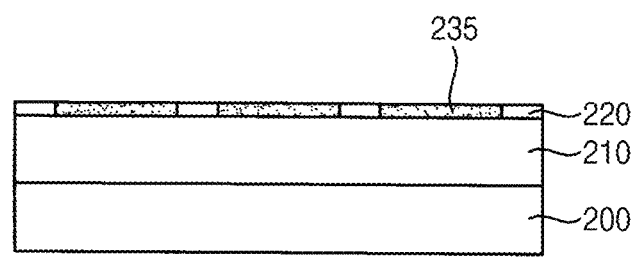

Referring to FIG. 9, upper portions of the guide pattern 220 and the neutral layer 230 may be removed. Accordingly, a neutral layer pattern 235 may be formed, and the guide pattern 220 and the neutral layer pattern 235 may be alternately arranged on the object layer 210. Top surfaces of the guide pattern 220 and the neutral layer pattern 235 may be coplanar with each other.

Figure 10:
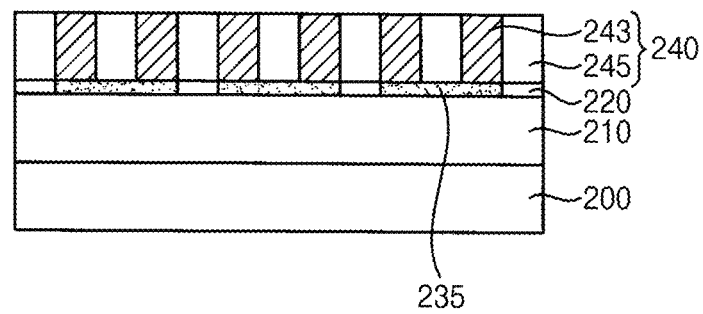

Referring to FIG. 10, a self-aligned layer 240 may be formed on the guide pattern 220 and the neutral layer pattern 235. The self-aligned layer 240 may include a first self-aligned pattern 243 and a second self-aligned pattern 245.

In example embodiments, the self-aligned layer 240 may be formed using a block copolymer purified by a process as illustrated with reference to FIGS. 1 to 5. As described above, homopolymers may be removed from the block copolymer using an adsorbent to obtain the block copolymer having a high purity. The block copolymer may include a first polymer unit that may be relatively hydrophobic and a second polymer unit that may be relatively hydrophilic. For example, the first polymer unit may include PS, and the second polymer unit may include PMMA, PDMS, PVP or PEO. In this case, the block copolymer may include PS-b-PMMA, PS-b-PDMS, PS-b-PVP or PS-b-PEO.

In example embodiments, the first polymer units may be self-aligned to form the first self-aligned pattern 243, and the second polymer units may be self-aligned to form the second self-aligned pattern 245. Hereinafter, an exemplary embodiment of using PS-b-PMMA as the block copolymer is described.

While the self-aligned layer 240 is deposited or coated on the guide pattern 220 and the neutral layer pattern 235, relatively hydrophilic PMMA may be guided toward the guide pattern 220. Thus, PMMA may be self-aligned on the guide pattern 220 to form the second self-aligned pattern 245. Subsequently, the first self-aligned pattern 243 including PS and the second self-aligned pattern 245 may be alternately arranged on the neutral layer pattern 235.

As described with reference to FIGS. 1 to 5, if the homopolymers (e.g., PS) co-exist with the block copolymer, the homopolymers may be inserted between the first self-aligned pattern 243 and the second self-aligned pattern 245 to cause a swelling of the self-aligned layer 240. In this case, a distance between the neighboring self-aligned patterns (hereinafter, referred to as a domain spacing "DS") may be increased. Further, the homopolymers may interrupt the self-alignment of the polymer units. Thus, minute patterns of a desired pitch may not be formed. However, according to example embodiments, the homopolymers that may not participate in a copolymerization may be removed from the block copolymer so that the self-aligned patterns arranged by desired pitch, distance or line spacing LS may be obtained.

In one example embodiment, a curing process or an annealing process may be further performed on the self-aligned layer 240.

Figure 11:
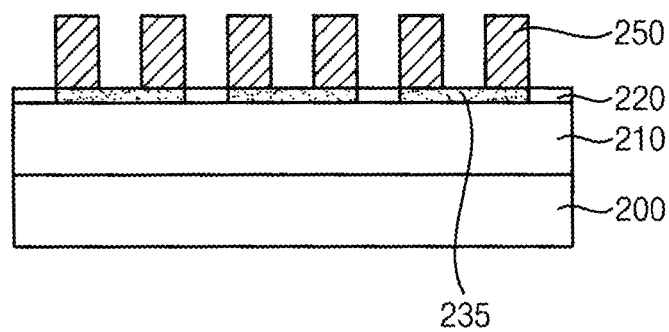

Referring to FIG. 11, one of the first self-aligned pattern 243 and the second self-aligned pattern 245 may be removed to form a mask pattern 250.

In example embodiments, either of the first and second self-aligned patterns 243 and 245, which may have a faster etching rate or a lower etching resistance may be removed. For example, the second self-aligned pattern 245 including PMMA may be removed by an ultraviolet (UV) irradiation, or a plasma etching process or a reactive ion etching (RIE) process using oxygen.

The first self-aligned patterns 243 may remain on the neutral layer pattern 235 to be defined as the mask pattern 250.

Figure 12:
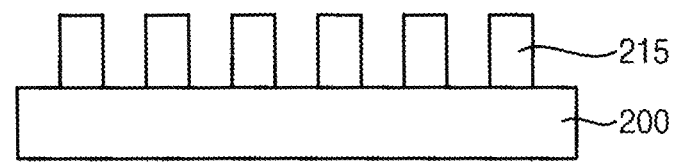

Referring to FIG. 12, the guide pattern 220 and the neutral layer pattern 235 exposed between the neighboring mask patterns 250 may be etched, and then a portion of the object layer 210 subsequently exposed between the neighboring mask patterns 250 may be etched to form an object layer pattern 215.

The mask pattern 250 and a remaining portion of the neutral layer pattern 235 may be removed by an ashing process, a strip process, a chemical mechanical polish (CMP) process, an etch-back process, etc.

According to example embodiments of the present invention, the object layer 210 may be etched using the mask pattern 250 arranged by a regular and minute pitch so that the object layer pattern 215 having desired minute width and/or line spacing LS may be obtained.

FIG. 13 to FIG. 20 are cross-sectional views and a top plan view illustrating a method of manufacturing a semiconductor device in accordance with example embodiments. Specifically, FIGS. 13 to 16 and FIGS. 18 to 20 are cross-sectional views illustrating the method of manufacturing the semiconductor device, and FIG. 17 is a top plan view illustrating the method of manufacturing the semiconductor device.

FIGS. 13 to 20 illustrate a method of manufacturing a vertical memory device using the methods of forming patterns illustrated with reference to FIGS. 6 to 12. Thus, detailed descriptions on processes substantially the same or similar to those illustrated with reference to FIGS. 6 to 12 are omitted.

In FIGS. 13 to 20, a direction substantially perpendicular to a top surface of a substrate is referred to as a first direction, and two directions substantially parallel to the top surface of the substrate and crossing each other are referred to as a second direction and a third direction. For example, the second and third directions are substantially perpendicular to each other. Additionally, a direction indicated by an arrow in the figures and a reverse direction thereof are considered as the same direction.

Figure 13:
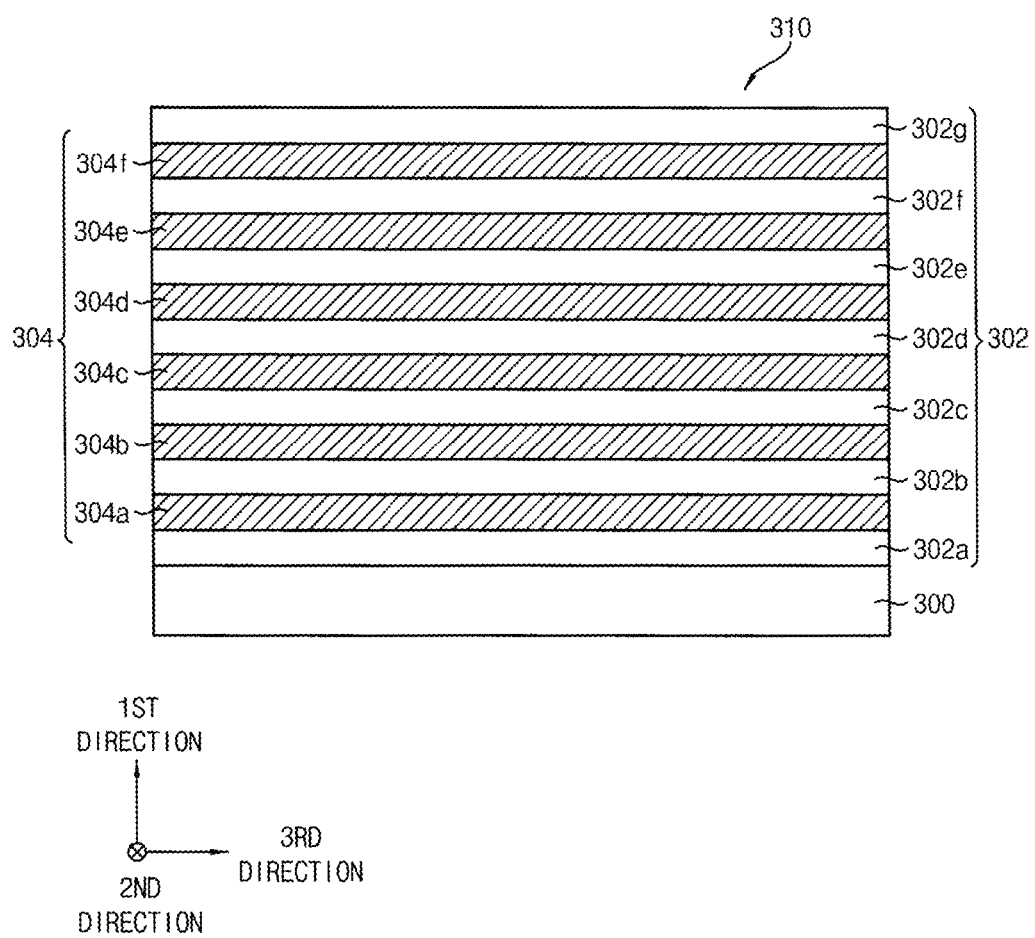

Referring to FIG. 13, insulating interlayers 302 and sacrificial layers 304 may be formed alternately and repeatedly on a substrate 300 to form a mold structure 310.

The substrate 300 may include a semiconductor material, e.g., single crystalline silicon and/or germanium.

In example embodiments, the insulating interlayer 302 may be formed using silicon oxide. The sacrificial layer 304 may be formed using a material that may have a high etching selectivity with respect to the insulating interlayer 302. The sacrificial layer 304 may be formed using silicon nitride.

The insulating interlayer 302 and the sacrificial layer 304 may be formed by, e.g., a chemical vapor deposition (CVD) process, a plasma enhanced chemical vapor deposition (PECVD) process, an atomic layer deposition (ALD) process, or a spin coating process, e.g. A lowermost insulating interlayer 302a may be formed by performing a thermal oxidation process on the substrate 300.

Figure 14:
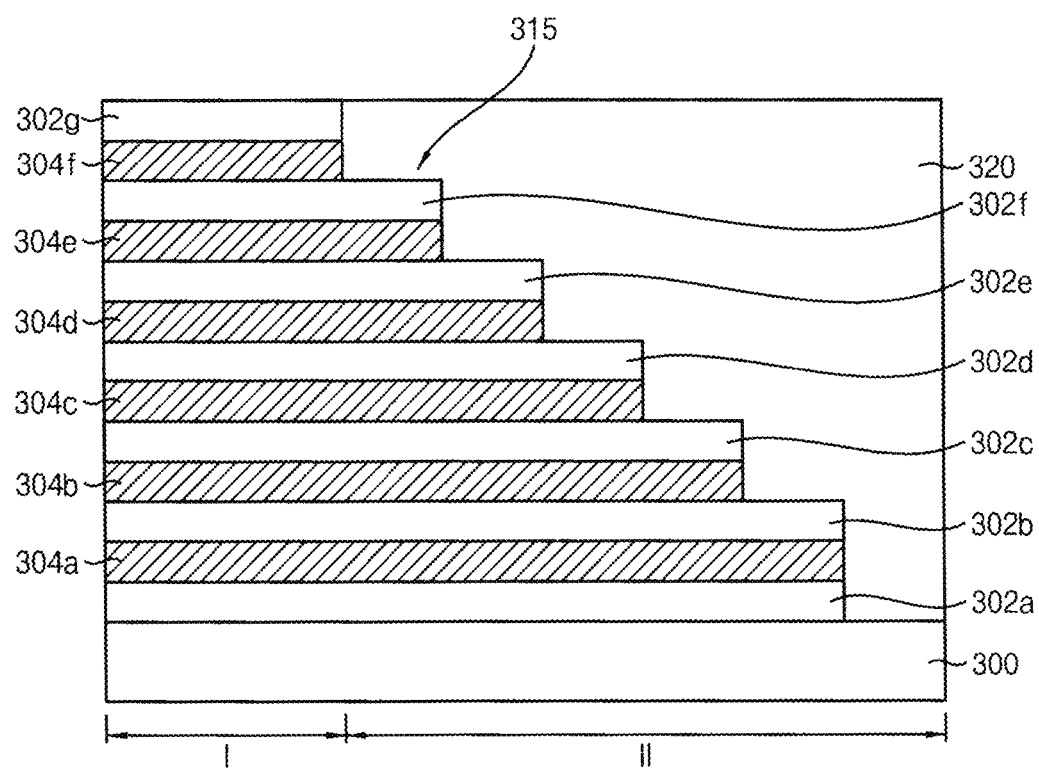

Referring to FIG. 14, lateral portions of the mold structure 310 may be etched to form a stepped mold structure 315.

In example embodiments, a photoresist pattern (not illustrated) may be formed on the mold structure 310. The lateral portion of the mold structure 310 may be etched using the photoresist pattern as an etching mask. The lowermost insulating interlayer 302a may be partially removed during the etching process such that the top surface of the substrate 300 may be exposed.

The photoresist pattern may be partially removed such that a width of the photoresist pattern may be reduced. The lateral portion of the mold structure 310 may be etched again using the photoresist pattern as an etching mask until a top surface of a second insulating interlayer 302b is exposed. The photoresist pattern may be partially removed such that a width of the photoresist pattern may be additionally reduced. The lateral portion of the mold structure 310 may be etched again using the photoresist pattern as an etching mask until a top surface of a third insulating interlayer 302c is exposed. The above-mentioned process may be repeated to form the stepped mold structure 315 including a plurality of steps or stairs stacked in the first direction.

An insulation layer covering the stepped mold structure 315 may be formed on the substrate 300 using, e.g., silicon oxide. An upper portion of the insulation layer may be planarized until the uppermost insulating interlayer 302g is exposed to form a first insulation layer 320 covering a lateral portion or the steps of the stepped mold structure 315.

The substrate 300 may be divided into a cell region I and an extension region II by the formation of the stepped mold structure 315. The extension region II of the substrate 300 may overlap the steps or the stairs of the stepped mold structure 315. Channels 340 (see FIG. 16) may be formed on the cell region I such that cell strings may be formed on the cell region I. Wiring contacts 385 and wirings 390 (see FIG. 20) may be formed on the extension region II. FIG. 14 illustrates one extension region II, however, two extension regions II may be defined at both ends of the cell region I.

Referring to FIG. 15, a channel hole 325 may be formed through the stepped mold structure 315 on the cell region I. The top surface of the substrate 300 may be exposed through the opening 325.

In example embodiments, a plurality of the channel holes 325 may be formed in the second direction to form a channel row. A plurality of the channel rows may be arranged in the third direction to form a channel hole array.

Figure 16:
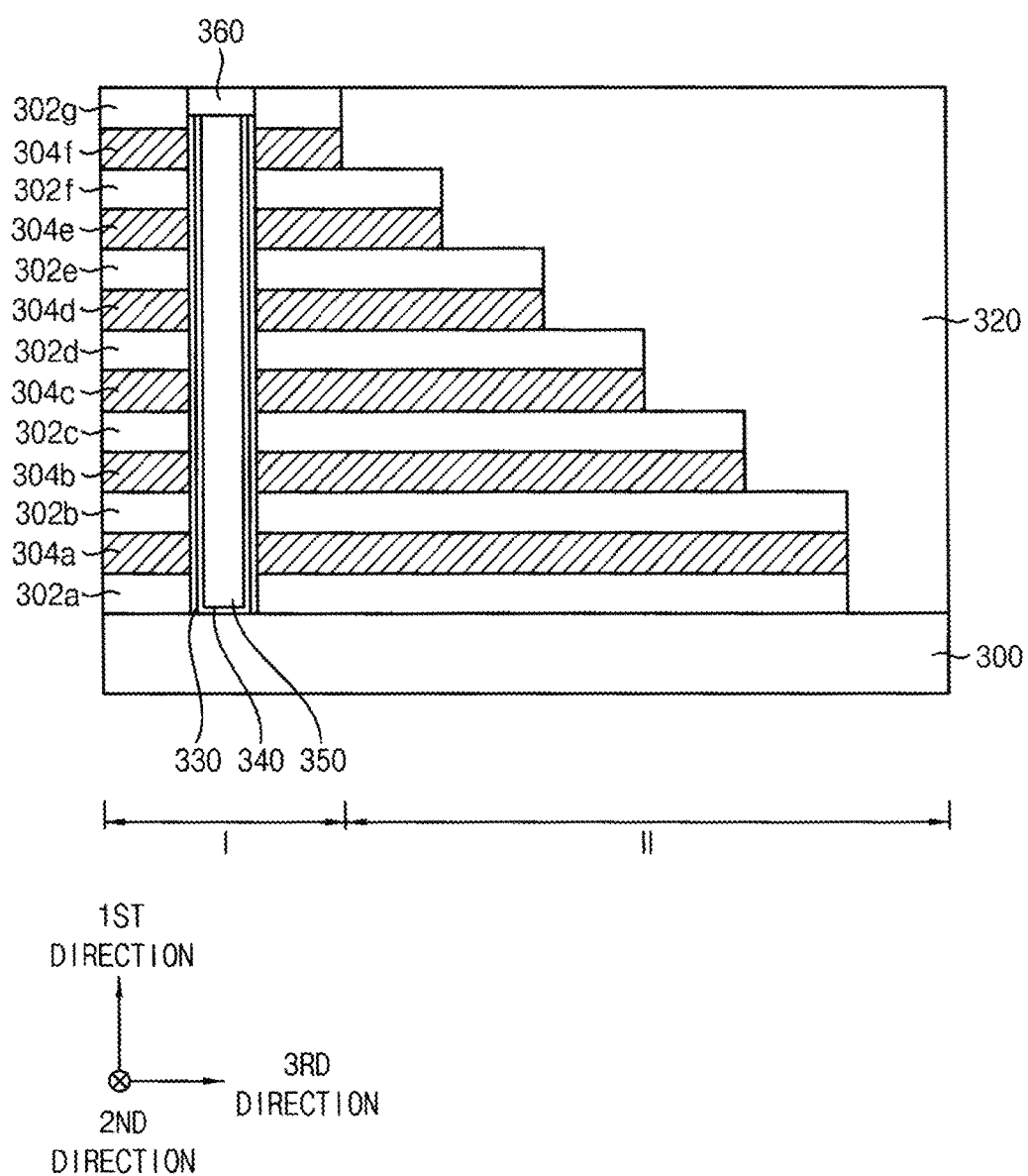

Referring to FIG. 16, a dielectric layer structure 330, a channel 340 and a filling layer pattern 350 partially filling the channel hole 325 may be formed in the channel hole 325. A pad 360 capping an upper portion of the channel hole 325 may be formed on the dielectric layer structure 330, the channel 340 and the filling layer pattern 350.

In example embodiments, the dielectric layer structure 330 may be formed on a sidewall of the channel hole 325. A channel layer may be formed on the uppermost insulating interlayer 302g, the first insulation layer 320, the dielectric layer structure 330 and the exposed top surface of the substrate 300. A filling layer may be formed on the channel layer to sufficiently fill the channel hole 325. Upper portions of the channel layer and the filling layer may be planarized until top surfaces of the uppermost insulating interlayer 302g and/or the first insulation layer 320 are exposed to form the channel 340 and the filling layer pattern 350.

The dielectric layer structure 330 may have a hollow cylindrical shape or (e.g., like a straw). The channel 340 may have a cup shape. The filling layer pattern 350 may be a solid cylinder or a pillar. In other examples, the channel 340 may be a solid cylinder or a pillar. In this case, the formation of the filling layer pattern 350 may be omitted.

Upper portions of the dielectric layer structure 330, the channel 340 and the filling layer pattern 350 may be removed by, e.g., an etch-back process to form a recess. A pad layer filling the recess may be formed on the uppermost insulating interlayer 302g and the first insulation layer 320. An upper portion of the pad layer may be planarized to form the pad 360.

The dielectric layer structure 330 may be obtained by sequentially forming a blocking layer, a charge storage layer and a tunnel insulation layer. For example, the dielectric layer structure 330 may have an oxide-nitride-oxide (ONO) layered structure. The channel layer and the pad layer may be formed using polysilicon or amorphous silicon which may be optionally doped with impurities. A crystallization process including, e.g., a heat treatment or a laser irradiation may be further performed on the channel layer and/or the pad layer. The filling layer may be formed using, e.g., silicon oxide.

A plurality of the channels 340 may be formed in the second and third directions to form a channel array comparable to the channel hole array.

Referring to FIG. 17, a portion of the stepped mold structure 315 between the neighboring channels 340 may be etched to form an opening 365.

In example embodiments, the opening 365 may extend in the third direction, and a plurality of the openings 365 may be formed in the second direction. The top surface of the substrate 300 may be exposed through the opening 365, and the insulating interlayers 302 and the sacrificial layers 304 may exposed by a sidewall of the opening 365.

Figure 18:
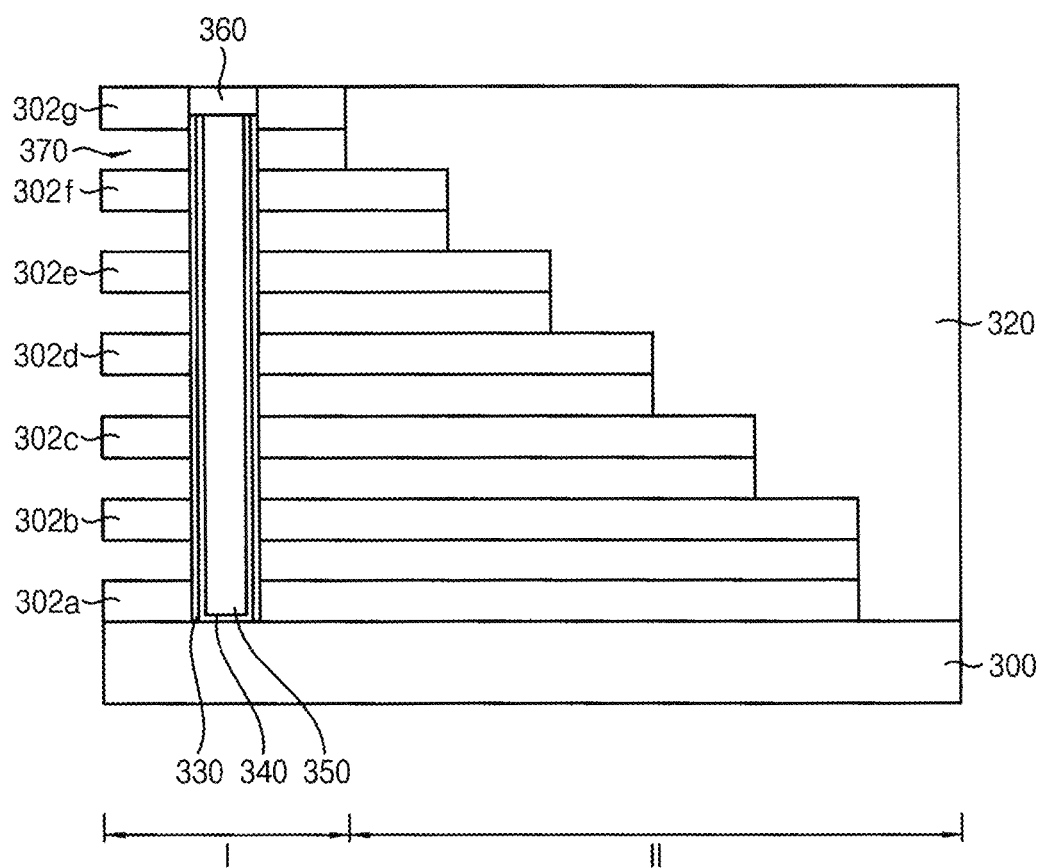

Referring to FIG. 18, the sacrificial layers 304 exposed at the sidewall of the opening 365 may be removed.

In example embodiments, the sacrificial layers 304 may be selectively removed by a wet etching process using an etchant solution that may contain phosphoric acid or sulfuric acid.

A gap 370 may be formed at each space from which the sacrificial layer 340 is removed. An outer sidewall of the dielectric layer structure 330 may be exposed by the gap 370.

Figure 19:
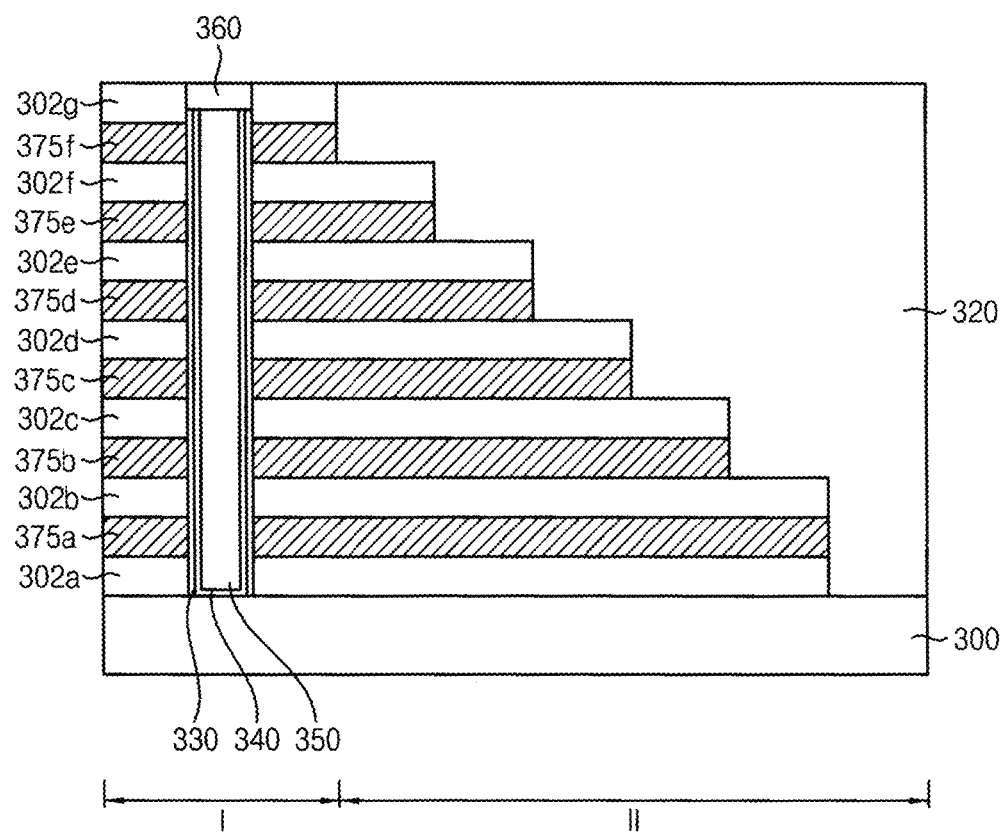

Referring to FIG. 19, a gate line 375 may be formed in each gap 370.

In example embodiments, a gate electrode layer may be formed within gaps 370, on the outer sidewall of the dielectric layer structure 330 and on the surfaces of the insulating interlayers 302. The gate electrode layer may fill the gaps 370 at each level and may partially fill the openings 365 (seen in FIG. 17). The gate electrode layer may be formed using a metal or a metal nitride by, e.g., a sputtering process, an ALD process or a CVD process.

A portion of the gate electrode layer formed in the opening 365 may be etched to form the gate lines 375a to 375f.

In example embodiments, a lowermost gate line 375a may serve as a ground selection line (GSL). Four gate lines 375b, 375c, 375d and 375e on the GSL may serve as word lines, and an uppermost gate line 375f on the word lines 375 may serve as a string selection line (SSL). FIG. 19 illustrates that the GSL, the word line and the SSL are formed at 1 level, 4 levels and 1 level, respectively. However, the number of word lines and the numbers of the levels at which the GSL, the word line and the SSL are formed are not specifically limited. In some example embodiments, each of the GSL and the SSL may be formed at 2 levels (e.g., 2 GSL and 2 SSL), and/or 2, 8, 12, 16, etc. word lines 375 may be formed.

Referring to FIG. 20, a second insulation layer 380 may be formed on the uppermost insulating interlayer 302g and the first insulation layer 320 to cover the pad 360. The second insulation layer 380 may be formed using, e.g., silicon oxide by a CVD process or a spin coating process.

The wiring contacts 385 may be formed through the second insulation layer 380, the first insulation layer 320 and the insulating interlayer 302 to be in contact the gate lines 375. The wiring contacts 385 may be formed on the extension region II. The wirings 390 may be formed on the second insulation layer 380 to be electrically connected to the wiring contacts 385.

In example embodiments, the wirings 390 may be formed by processes the same as or similar to those illustrated with reference to FIGS. 6 to 12. For example, a conductive layer may be formed as an object layer on the second insulation layer 380. The conductive layer may be formed using a metal, a metal nitride or doped polysilicon using, e.g., a sputtering process or an ALD process. A mask pattern may be formed on the conductive layer by the processes the same as or similar to those illustrated with reference to FIGS. 6 to 12. The conductive layer may be etched using the mask pattern to form the wirings 390.

The mask pattern may be formed using a block copolymer purified as described herein, e.g., as described with respect to FIGS. 1 to 5 (e.g., by a DSA method).

As an integration degree of the vertical memory device becomes larger, the stacked number of the gate lines 375 may be increased. Accordingly, the number of the wirings 390 electrically connected to the gate lines 375 may be also increased. Thus, the wirings 390 having a minute width or a fine pitch may be needed. In example embodiments, the wirings 390 having a line spacing LS less than, e.g., about 40 nm may be efficiently formed using the block copolymer purified according to example embodiments.

A bit line contact 387 may be formed through the second insulation layer 380 to contact the pad 360. A bit line 395 may be formed on the second insulation layer 380 to be electrically connected to the pad 360 via the bit line contact 387.

The bit line contact 387 may be formed by a process the same as or similar to that for the wiring contact 385. The bit line contact 387 and the wiring contact 385 may be formed simultaneously by the same patterning and deposition processes. The bit line 395 may be formed by a process the same as or similar to that for the wiring 390. The bit line 395 and the wiring 390 may be formed by the same patterning and deposition processes.

In example embodiments, the bit line 395 and the wiring 390 may extend in the same direction, e.g., the second direction. Alternatively, the bit line 395 may extend in a different direction from that of the wiring 390.

The bit line 395 and the wiring 390 may be formed on the same plane as illustrated in FIG. 20. However, the bit line 395 may be formed on a different plane from that of the wiring 390. For example, the wirings 390 may be formed on the first insulation layer 320, the second insulation layer 380 may cover the wirings 390, and the bit line 395 may be formed on the second insulation layer 380.

Hereinafter, properties of block copolymers purified in accordance with example embodiments are described with reference to Example and Comparative Example.

Comparative Example

Preparations of as-Synthesized PS-b-PMMA 200 ml of THF was put in a 1 L reactor. The reactor was cooled to a temperature of −78° C. and stirred. An initiator including sec-BuLi was added into the reactor and the mixture was stirred. After about 15 minutes, 56 mmol equivalent of styrene monomers was slowly added into the reactor and stirred for 1 hour. An excessive amount of 1.1-diphenylethyene (DPE) was added as a blocking agent of synthesized PS. 113.7 mmol (11.386 g) of MMA monomers was slowly added to the resulting mixture and stirred for 1 hour to initiate a copolymerization. 2 ml of methanol was added to terminate the copolymerization. The reactor was heated to a room temperature at a reduced pressure. The resultant product was put in 2 L methanol. Accordingly, white copolymers were precipitated and collected by a repeated filtration. The product was dried in an oven of 47° C. for 3 days to obtain an as-synthesized PS-b-PMMA.

Example

PS homopolymers were removed from the as-synthesized PS-b-PMMA prepared by Comparative Example by the purification method as described in FIGS. 1 to 5. Specifically, THF and IO were mixed by a volume ratio of 60:40 to form a 1 L solvent. An excessive amount of silica particles was dispersed in the solvent to prepare an adsorbent solution. The as-synthesized PS-b-PMMA of Comparative Example was dissolved in a 1 L solvent containing THF and IO of the same volume ratio as mentioned above to prepare a block copolymer solution.

The adsorbent solution and the block copolymer solution were mixed and stirred for 2 hours. The silica particles on which PS-b-PMMA was adsorbed were filtered from the mixed solution using a filter paper. The silica particles were washed by an excessive amount of THF. The washed product was concentrated, and then put into 2 L of methanol to precipitate PS-b-PMMA. The precipitated PS-b-PMMA was filtrated, and then dried in an oven of 50° C. for 3 days.

Figure 21:
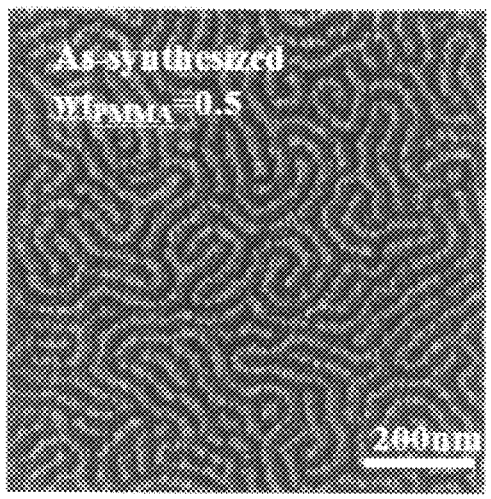
Figure 22:
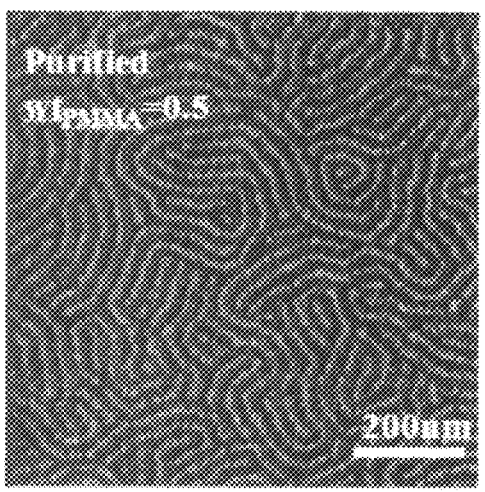

FIGS. 21 and 22 are atomic force microscope (AFM) images showing PS-b-PMMA obtained from Comparative Example and Example, respectively.

Physical and chemical properties of PS-b-PMMA obtained by Comparative Example and Example are shown in Table 1 below.

TABLE 1

|  | Weight Average Molecular weight (g/mol) | PDI | Weight Ratio of PMMA | Domain Spacing (DS) |
| --- | --- | --- | --- | --- |
| Comparative Example (As-synthesized) | 39k | 1.44 | 0.50 | 40.7 nm |
| Example (purified) | 62k | 1.14 | 0.51 | 35.9 nm |

Referring to FIGS. 21 and 22, and Table 1, PS-b-PMMA prepared by Example had a DS smaller than that of the as-synthesized PS-b-PMMA of Comparative Example. It may be acknowledged that PS homopolymers were at least substantially removed in Example and self-aligned patterns were formed by substantially pure or pure PS and PMMA units (e.g., with less than 1 wt % of unreacted homopolymers or, in this example, less than 1 wt % of PS homopolymers). The unreacted homopolymers may be less than 1 wt % of the block copolymer, but may be preferably less, such as less than 0.2 wt %, or less than 0.05 wt %. However, in the as-synthesized PS-b-PMMA of Comparative Example, the PS homopolymers were inserted as impurities between the self-aligned patterns to increase the DS. Specifically, the DS of PS-b-PMMA of Example was measured as 35.9 nm. Thus, minute patters having a pitch of less than about 40 nm may be obtained using PS-b-PMMA of Example.

PS-b-PMMA of Example had a poly dispersity index (PDI) less than 1.4, which is less than that of the as-synthesized PS-b-PMMA of Comparative Example. The block copolymers of the disclosed embodiments may have a PDI less than 1.4, less than 1.25 and/or less than 1.15. It may be acknowledged that the PS homopolymers were removed from the block copolymer, and thus a distribution of a molecular weight was decreased.

A weight average molecular weight of the block copolymer for forming minute patterns is greater than 50,000 g/mol and, for example, may range from about 50,000 to about 70,000 g/mol. If the weight average molecular weight is significantly less than about 50,000 g/mol, physical and chemical properties of a self-aligned layer may be deteriorated. If the weight average molecular weight significantly exceeds about 70,000 g/mol, a viscosity of a composition including the block copolymer may be excessively increased so that the self-aligned layer having a uniform thickness may not be formed.

As shown in Table 1, the weight average molecular weight of PS-b-PMMA of Example was measured as 62,000 g/mol. Thus, the self-aligned layer having an improved layer property may be formed using the block copolymer from which the PS homopolymers are removed as described in Example.

According to example embodiments, PS homopolymers may be removed using an adsorbent in a preparation of a block copolymer. Therefore, the block copolymer having a high purity may be obtained.

The block copolymer may be utilized for a formation of wirings or contacts having a minute width and/or a fine pitch implemented in various semiconductor devices, e.g., a vertical memory device, a dynamic random access memory device, a NAND flash device, etc., by a DSA method.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device using a block copolymer, comprising:
   preparing a blend solution that includes a block copolymer and an adsorbent, the block copolymer being synthesized by a copolymerization between a first polymer unit and a second polymer unit having a hydrophilicity greater than that of the first polymer unit;
   extracting the adsorbent on which the block copolymer is adsorbed;
   separating the block copolymer from the adsorbent;
   collecting the block copolymer;
   forming an object layer on a substrate;
   forming a mask on the object layer using the block copolymer; and
   etching the object layer with the mask.

2. The method of claim 1, wherein the adsorbent includes silica particles or zirconia particles.

3. The method of claim 1, wherein the second polymer unit is adsorbed on the adsorbent.

4. The method of claim 1, wherein the first polymer unit includes polystyrene (PS), and
   wherein the second polymer unit is selected from the group of polymethylmethacrylate (PMMA), polydimethylsiloxane (PDMS), polyvinylpyrrolidone (PVP) and polyethyleneoxide (PEO).

5. The method of claim 1, wherein the preparing the blend solution includes:
   mixing a first solvent and the adsorbent to prepare an adsorbent solution;
   mixing a second solvent and the block copolymer to prepare a first block copolymer solution; and
   mixing the adsorbent solution and the first block copolymer solution.

6. The method of claim 5, wherein the first solvent and the second solvent include a main solvent and an assistance solvent, the assistance solvent having a polymer solubility less than that of the main solvent.

7. The method of claim 6,
   wherein the main solvent includes at least one selected from the group of tetrahydrofuran (THF), triethylamine (TEA), dimethylformamide (DMF), ethylacetate and dimethyl sulfoxide (DMSO), and
   wherein the assistance solvent includes isooctane (IO).

8. The method of claim 5, wherein a portion of the first polymer unit does not participate in the copolymerization to remain in the first block copolymer solution as homopolymers.

9. The method of claim 8, wherein the block copolymer is adsorbed on the adsorbent, and the homopolymers are substantially excluded from the adsorbent.

10. The method of claim 5,
    wherein the extracting the adsorbent includes providing the blend solution on a filter to filtrate the adsorbent, and
    wherein the separating the block copolymer from the adsorbent includes providing a desorption solvent on the filtrated adsorbent to prepare a second block copolymer solution that includes the block copolymer desorbed from the adsorbent.

11. The method of claim 10, wherein the desorption solvent includes at least one selected from the group of THF, TEA, DMF, ethylacetate and DMSO.

12. The method of claim 10, wherein the collecting the block copolymer includes providing the second block copolymer solution into a polymer precipitation solvent to precipitate the block copolymer.

13. The method of claim 1,
    wherein the first and second polymer units are deposited on the object layer and form self-aligned patterns on the object layer, and
    wherein a weight average molecular weight of the collected block copolymer ranges from about 50,000 to about 70,000 g/mol.

14. The method of claim 1, wherein the adsorbent comprises inorganic oxide particles.

15. The method of claim 14, wherein the inorganic oxide particles of the adsorbent have an average particle size of from 1 to 100 microns.

16. The method of claim 1, wherein the adsorbent comprises a porous inorganic oxide filter.

17. The method of claim 1, wherein the collected block copolymer comprises less than 1 wt % of unreacted first or second polymer.

18. A method of manufacturing a semiconductor device, comprising:
    forming an object layer on a substrate;
    forming a guide pattern and a neutral layer pattern on the object layer;
    preparing a block copolymer solution that includes a block copolymer having a self-aligned property and homopolymers;
    selectively extracting the block copolymer by an adsorbent;
    forming a self-aligned layer that includes the extracted block copolymer on the guide pattern and the neutral layer pattern, such that a first self-aligned pattern and a second self-aligned pattern aligned on the neutral layer pattern and the guide pattern, respectively, are formed;
    removing one of the first self-aligned pattern and the second self-aligned pattern to form a mask pattern; and
    partially etching the object layer using the mask pattern to form an object layer pattern.

19. The method of claim 18, wherein the block copolymer includes polystyrene-b-polymethylmethacrylate (PS-b-PMMA), and the homopolymers includes polystyrene that is not copolymerized.

20. A method of manufacturing a semiconductor device, comprising;
    preparing a blend solution that includes a block copolymer and an adsorbent, the block copolymer being synthesized by a copolymerization between a first polymer unit and a second polymer unit having a hydrophilicity greater than that of the first polymer unit;

extracting the adsorbent on which the block copolymer is adsorbed;

separating the block copolymer from the adsorbent;

collecting the block copolymer;

forming a mold structure on a substrate by stacking insulating interlayers and sacrificial layers alternately and repeatedly on the substrate;

forming a plurality of channels through the mold structure;

replacing the sacrificial layer of each level with the gate line;

forming wiring contacts through the insulating interlayers such that each one of the wiring contacts makes contact with the gate line of the each level;

forming a conductive layer on the wiring contacts and an uppermost one of the insulating interlayers;

forming a mask on the conductive layer using the block copolymer; and etching the conductive layer with the mask to form wirings electrically connected to the wiring contacts.

\* \* \* \* \*